(12) United States Patent
Wang et al.

(10) Patent No.: US 11,404,507 B2
(45) Date of Patent: Aug. 2, 2022

(54) DISPLAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/841,190

(22) Filed: Apr. 6, 2020

(65) Prior Publication Data

US 2021/0036075 A1 Feb. 4, 2021

(30) Foreign Application Priority Data

Aug. 1, 2019 (CN) .......................... 201910707578.3

(51) Int. Cl.
*H01L 27/32* (2006.01)
*H01L 51/00* (2006.01)
(Continued)

(52) U.S. Cl.
CPC ...... *H01L 27/3258* (2013.01); *H01L 27/3246* (2013.01); *H01L 27/3248* (2013.01);
(Continued)

(58) Field of Classification Search
CPC ............. H01L 27/3258; H01L 27/3246; H01L 27/3248; H01L 27/3262; H01L 51/0023;
(Continued)

(56) References Cited

U.S. PATENT DOCUMENTS

| 7,612,850 B2 * | 11/2009 | Inoue .................. G02F 1/13439 349/114 |
| 2007/0058099 A1 * | 3/2007 | Eguchi .............. G02F 1/136227 349/43 |

(Continued)

FOREIGN PATENT DOCUMENTS

| CN | 102881655 A | 1/2013 |
| CN | 105742292 A | 7/2016 |
| CN | 105892233 A | 8/2016 |

OTHER PUBLICATIONS

First Office Action for Chinese Application No. 201910707578.3, dated Mar. 3, 2021, 6 Pages.

*Primary Examiner* — Dzung Tran
(74) *Attorney, Agent, or Firm* — Brooks Kushman P.C.

(57) ABSTRACT

A display substrate, a method for manufacturing the same, and a display device are provided. The method includes: forming a thin film transistor (TFT) array layer on a base substrate; forming a planarization layer covering the TFT array layer; forming a transition layer on the planarization layer, an adhesion between the transition layer and a photoresist is weaker than an adhesion between the planarization layer and the photoresist; forming the photoresist on the transition layer, exposing and developing the photoresist to form a first photoresist pattern; by using the first photoresist pattern as a mask, etching the transition layer to form a first via hole, and etching the planarization layer through the first via hole to form a second via hole, an orthographic projection of the first via hole onto the base substrate overlaps with an orthographic projection of the second via hole onto the base substrate.

14 Claims, 3 Drawing Sheets

(51) Int. Cl.
*H01L 51/52* (2006.01)
*H01L 51/56* (2006.01)
*H01L 27/12* (2006.01)

(52) U.S. Cl.
CPC ...... *H01L 27/3262* (2013.01); *H01L 51/0023* (2013.01); *H01L 51/5234* (2013.01); *H01L 51/56* (2013.01); *H01L 27/1248* (2013.01); *H01L 27/1288* (2013.01); *H01L 51/5206* (2013.01); *H01L 2227/323* (2013.01); *H01L 2251/5307* (2013.01); *H01L 2251/5315* (2013.01)

(58) Field of Classification Search
CPC . H01L 51/5234; H01L 51/56; H01L 27/1248; H01L 27/1288
USPC .......................................................... 257/72
See application file for complete search history.

(56) References Cited

U.S. PATENT DOCUMENTS

| | | | |
|---|---|---|---|
| 2008/0111135 A1* | 5/2008 | Choi ................... | H01L 51/0021 257/71 |
| 2010/0002162 A1* | 1/2010 | Morimoto ......... | G02F 1/136213 349/38 |
| 2011/0186987 A1* | 8/2011 | Wang ................. | H01L 23/3192 257/737 |
| 2014/0042444 A1 | 2/2014 | Huang et al. | |
| 2016/0147110 A1* | 5/2016 | Tanabe .............. | G02F 1/136213 349/143 |

\* cited by examiner

DISPLAY SUBSTRATE, METHOD FOR MANUFACTURING THE SAME, AND DISPLAY DEVICE

CROSS-REFERENCE TO RELATED APPLICATION

This application claims priority to Chinese Patent Application No. 201910707578.3 filed on Aug. 1, 2019, which is incorporated herein by reference in its entirety.

TECHNICAL FIELD

The present disclosure relates to the field of display technologies, in particular to a display substrate, a method for manufacturing the display substrate, and a display device.

BACKGROUND

In a display substrate, due to unevenness between pixels caused by metal wiring, a problem of poor light-emitting uniformity of pixels may ensue. As a result, a planarization layer is required to reduce a level difference between pixels. However, due to a low uniformity of a photoresist coated on the planarization layer, in an image displayed by the display device etched by using a photoresist, a circular Mura (a phenomenon in which various artifacts are caused by an un-uniform brightness of a display device) may result, which impacts a display performance of the display device.

SUMMARY

In a first aspect, the present disclosure provides, in some embodiments, a method for manufacturing a display substrate, including:

forming a thin film transistor array layer on a base substrate;

forming a planarization layer covering the thin film transistor array layer;

forming a transition layer on the planarization layer, where an adhesion between the transition layer and a photoresist is weaker than an adhesion between the planarization layer and the photoresist;

forming the photoresist on the transition layer, exposing and developing the photoresist to form a first photoresist pattern;

etching the transition layer to form a first via hole penetrating the transition layer by using the first photoresist pattern as a mask; and etching the planarization layer through the first via hole to form a second via hole penetrating the planarization layer by using the first photoresist pattern as a mask, where an orthographic projection of the first via hole onto the base substrate overlaps with an orthographic projection of the second via hole onto the base substrate.

Further, the planarization layer is made of a silicon on glass (SOG) material.

Further, the etching the transition layer to form the first via hole penetrating the transition layer by using the first photoresist pattern as the mask includes:

wet-etching the transition layer to form the first via hole penetrating the transition layer by using the first photoresist pattern as the mask.

Further, the etching the planarization layer through the first via hole to form the second via hole penetrating the planarization layer by using the first photoresist pattern as the mask includes:

dry-etching the planarization layer through the first via hole to form the second via hole penetrating the planarization layer by using the first photoresist pattern as the mask.

Further, the forming the planarization layer covering the thin film transistor array layer includes:

forming an insulation layer covering the thin film transistor array layer; and forming the planarization layer covering the insulation layer.

Further, subsequent to the forming the second via hole penetrating the planarization layer, the method further includes:

forming the photoresist on the insulation layer and the transition layer, exposing and developing the photoresist to form a second photoresist pattern;

etching the insulation layer to form an insulation layer pattern by using the second photoresist pattern as a mask;

forming an anode material layer on the thin film transistor array layer and the transition layer;

forming the photoresist on the anode material layer, exposing and developing the photoresist to form a third photoresist pattern; and etching the anode material layer to form an anode by using the third photoresist pattern as a mask.

Further, subsequent to the forming the anode, the method further includes:

forming a pixel definition layer pattern on the base substrate formed with the anode;

forming a light-emitting layer in an area defined by the pixel definition layer pattern; and forming a transparent cathode layer on the light-emitting layer, where an orthographic projection of the cathode layer onto the base substrate covers the base substrate.

In a second aspect, the present disclosure further provides, in some embodiments, a display substrate, including:

a base substrate;

a thin film transistor array layer on the base substrate;

a planarization layer covering the thin film transistor array layer; and a transition layer on the planarization layer, where an adhesion between the transition layer and a photoresist is weaker than an adhesion between the planarization layer and the photoresist, the transition layer includes a first via hole, the planarization layer includes a second via hole, an orthographic projection of the first via hole onto the base substrate overlaps with an orthographic projection of the second via hole onto the base substrate.

Further, the display substrate further includes: an insulation layer between the thin film transistor array layer and the planarization layer, where the insulation layer covers the thin film transistor array layer, and the planarization layer covers the insulation layer.

Further, the insulation layer includes an insulation layer pattern, the display substrate further includes an anode, the anode is in contact with the insulation layer, the planarization layer and the transition layer through the first via hole, the second via hole and the insulation layer pattern, and the anode covers the transition layer.

Further, a thin film transistor formed in the thin film transistor array layer is a top-gate self-aligned type thin film transistor, an etch-stop layer type thin film transistor or a back-channel-etch type thin film transistor.

Further, the display substrate further includes a transparent cathode layer on a side of the transition layer that is facing away from the base substrate, the cathode layer is made of an oxide of at least one element selected from zinc, indium, aluminum, tin, magnesium, argentum, calcium, samarium and barium.

In a third aspect, the present disclosure further provides, in some embodiments, a display panel including the display substrate described above, where the display panel is a top-emitting display panel or a bottom-emitting display panel.

In a fourth aspect, the present disclosure further provides, in some embodiments, a display device including the display panel described above.

BRIEF DESCRIPTION OF THE DRAWINGS

In order to illustrate the technical solutions of the embodiments of the present disclosure in a clearer manner, the drawings required for the description of the embodiments of the present disclosure will be described hereinafter briefly. Obviously, the following drawings merely relate to some embodiments of the present disclosure, and based on these drawings, a person of ordinary skill in the art may obtain other drawings without any creative effort.

DETAILED DESCRIPTION

The technical solutions in the embodiments of the present disclosure will be described hereinafter clearly and completely with reference to the drawings of the embodiments of the present disclosure. Obviously, the described embodiments are merely a part of, rather than all of, the embodiments of the present disclosure, and based on these embodiments, a person of ordinary skill in the art may, without any creative effort, obtain other embodiments, which also fall within the scope of the present disclosure.

In the related art, a low uniformity of a photoresist coated on a planarization layer may result in a circular Mura in an image displayed by the display device etched by using the photoresist, which impacts a display performance of the display device.

In view of the above problem, a display substrate, a method for manufacturing the same and a display device are provided in embodiments of the present disclosure, which may solve the problem that a low uniformity of a photoresist coated on a planarization layer may result in a circular Mura in an image displayed by the display device etched by using the photoresist, thereby impacting a display performance of the display device.

Figure 1:
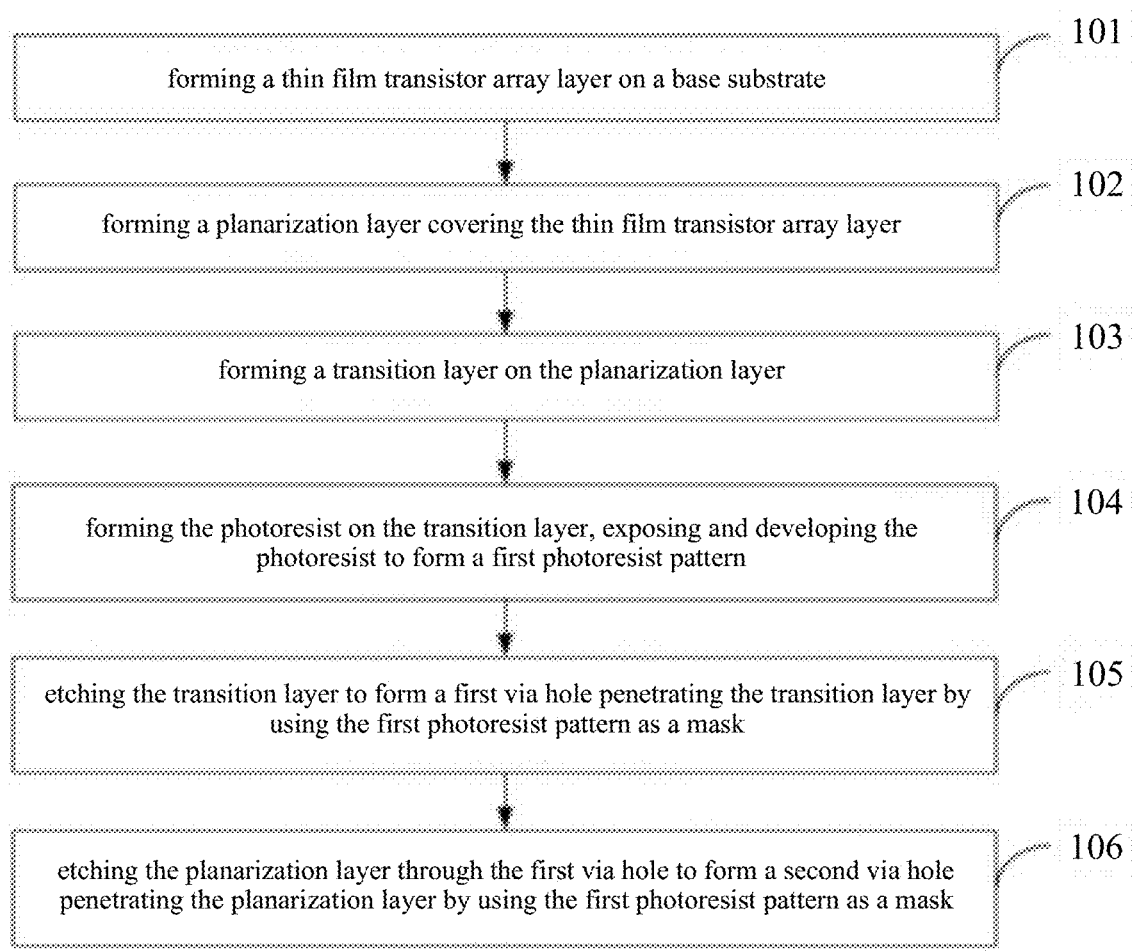
FIG. 1 is a flowchart of a method for manufacturing a display substrate according to some embodiments of the present disclosure.

A method for manufacturing a display substrate is provided in some embodiments of the present disclosure. As shown in FIG. 1, the method includes the following steps.

Step 101, forming a thin film transistor array layer on a base substrate.

Step 102, forming a planarization layer covering the thin film transistor array layer.

Step 103, forming a transition layer on the planarization layer, an adhesion between the transition layer and a photoresist is weaker than an adhesion between the planarization layer and the photoresist.

Step 104, forming the photoresist on the transition layer, exposing and developing the photoresist to form a first photoresist pattern.

Step 105, etching the transition layer to form a first via hole penetrating the transition layer by using the first photoresist pattern as a mask.

Step 106, etching the planarization layer through the first via hole to form a second via hole penetrating the planarization layer by using the first photoresist pattern as a mask, an orthographic projection of the first via hole onto the base substrate overlaps with an orthographic projection of the second via hole onto the base substrate.

In some embodiments of the present disclosure, since the transition layer is formed on the planarization layer, and the adhesion between the transition layer and the photoresist is weaker than the adhesion between the planarization layer and the photoresist, the photoresist may be coated more uniformly on the transition layer compared with being coated on the planarization layer. As a result, etching the transition layer and the planarization layer by using the first photoresist pattern formed by the photoresist as the mask may reduce or even eliminate a Mura phenomenon occurring in the image displayed by the display device, thereby improving the display performance of the display device. Therefore, the technical solution in the present disclosure may improve the display performance of the display device.

Figure 2:
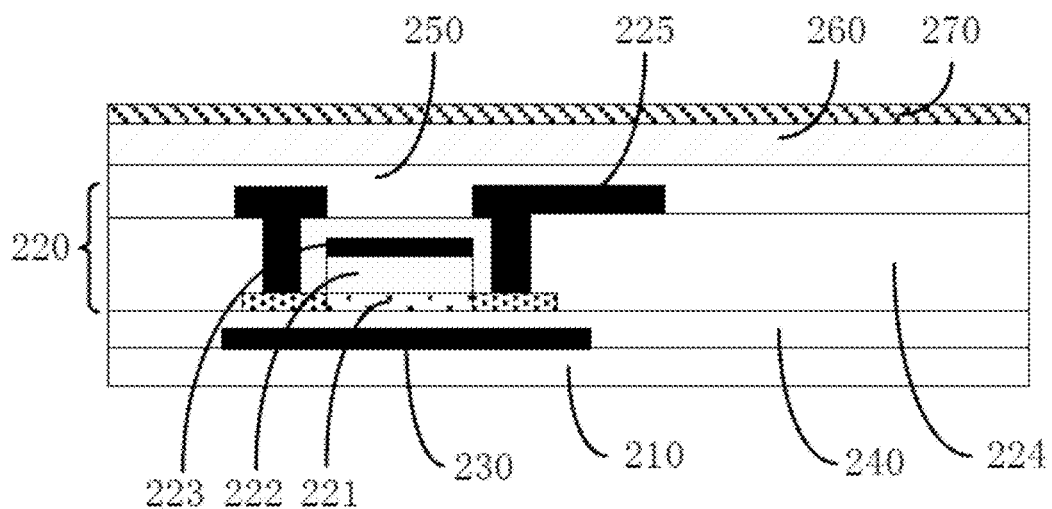
FIG. 2 is a section view of a display substrate in a stage of a method for manufacturing a display substrate according to some embodiments of the present disclosure.

As shown in FIG. 2, the base substrate 210 may be a flexible base substrate, such as a polyimide film, or a rigid base substrate, such as a quartz substrate or a glass substrate.

The thin film transistor array layer 220 may be formed jointly by a plurality of functional film layers, and the plurality of functional film layers may include an active layer 221, a gate insulation layer 222, a gate electrode 223, an interlayer insulation layer 224, a metal layer 225, etc. The plurality of functional film layers jointly form the thin film transistor array layer 220 having a thin film transistor structure. A source electrode of the thin film transistor, i.e., a metal structure in the plurality of functional film layers, is revealed on a side of the thin film transistor array layer 220 that is facing away from the base substrate 210.

The active layer 221 may be made of a metal oxide material, such as an indium gallium zinc oxide (IGZO) material. The active layer 221 may be formed by wet-etching an active material layer using a mask after the active material layer is formed.

The gate insulation layer 222 may be made of an insulation material such as silicon oxide, silicon nitride and silicon oxynitride. The gate electrode 223 may be made of a commonly used metal such as Mo, Al, Ti, Au, Cu, Hf, Ta, or an alloy material such as AlNd, MoNb, and copper alloy. After sequentially forming a gate insulation material layer and a gate layer, the gate electrode 223 is obtained by wet-etching the gate layer using a mask, and then the gate insulation layer 222 is obtained by dry-etching the gate insulation material layer using the same mask.

The interlayer insulation layer 224 may be made of an organic insulation material or an inorganic insulation material. Two via-holes penetrating the interlayer insulation layer 224 may be formed by photolithography, metal layers are deposited respectively at the two via-holes, and the metal layers are patterned to obtain source and drain electrodes, respectively.

A light-shield pattern 230 may be added between the thin film transistor array layer 220 and the base substrate 210. An orthographic projection of the active layer 221 onto the base substrate 210 falls within an orthographic projection of the light-shield pattern 230 onto the base substrate 210. The light-shield pattern 230 is used to shield the active layer 221 by blocking exterior light directed to the active layer 221. The light-shield pattern 230 may be made of a metal material, and the metal material may be a commonly used metal such as Mo, Al, Ti, Au, Cu, Hf, Ta, or an alloy material such as AlNd, MoNb.

In addition, a buffer layer 240 may be formed between the active layer 221 and the light-shield pattern 230. The buffer layer 240 may be made of an insulation material such as silicon oxide, silicon nitride and silicon oxynitride.

The planarization layer 260 may be directly formed on the thin film transistor array layer 220 if the planarization layer 260 is insulative, and is used to provide a planar surface, so that a level difference between pixels subsequently disposed on the planarization layer is small, thereby improving a flatness of the pixels to improve the display performance. The planarization layer 260 may be made of an organic resin, a silicon on glass (SOG) material, and the like. The SOG material may reduce the level difference between the pixels from 1.1 um to about 0.026 um, which greatly improves the flatness of pixels. The SOG material refers to a laminated material formed by bonding silicon (single crystal silicon, polysilicon, or porous silicon) with glass using a mechanical or chemical method.

Figure 3:
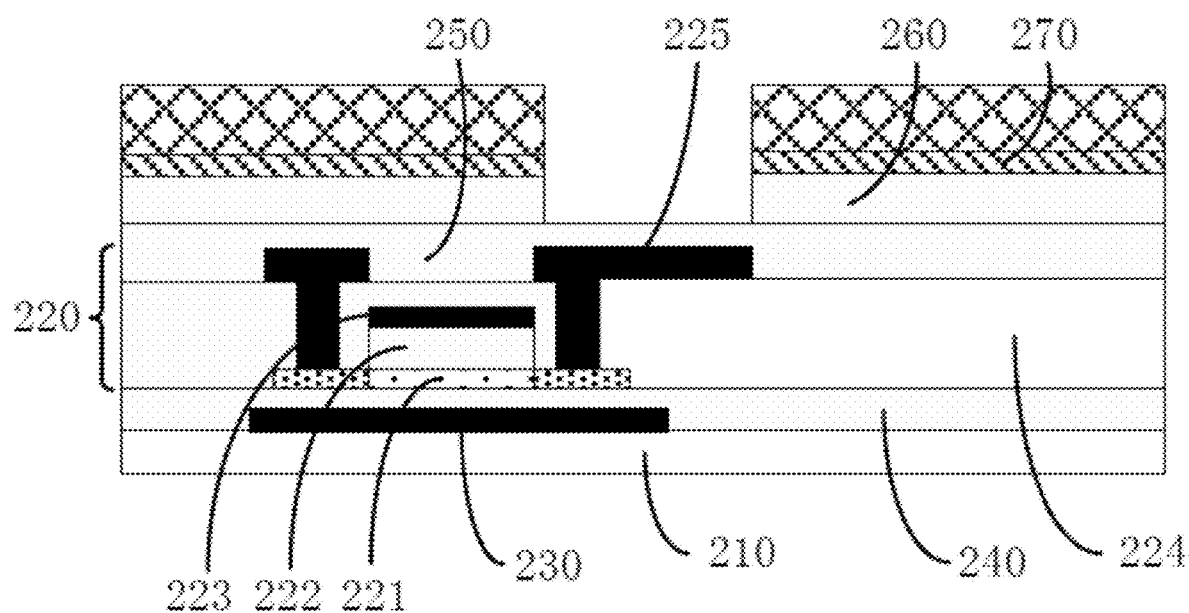
FIG. 3 is a section view of a display substrate in another stage of the method for manufacturing a display substrate according to some embodiments of the present disclosure.

In some embodiments of the present disclosure, by forming the transition layer 270 on the planarization layer 260, the photoresist may be formed on the transition layer 270 by coating it on the transition layer 270. The adhesion between the transition layer 270 and the photoresist is weaker than the adhesion between the planarization layer 260 and the photoresist, thus the photoresist may be coated more uniformly on the transition layer 270 compared with being coated on the planarization layer 260. The transition layer 270 and the planarization layer 260 are etched by using the first photoresist pattern, formed by exposing and developing the photoresist on the transition layer 270, as a mask, to obtain a first via hole penetrating the transition layer 270 and a second via hole penetrating the planarization layer 260, as shown in FIG. 3.

In this way, the Mura phenomenon occurring in the image displayed by the display device may be reduced or even eliminated without using an additional mask and without causing impact to other film layers of the display substrate.

The transition layer 270 may be made of a conductive material. For example, the transition layer 270 may be made of a metal material such as Mo, Al, or a metal oxide material such as indium tin oxide (ITO) or indium zinc oxide (IZO). The transition layer 270 may be obtained by performing a sputtering deposition on the planarization layer 260 using a sputtering device.

Further, the etching the transition layer to form the first via hole penetrating the transition layer by using the first photoresist pattern as the mask includes: wet-etching the transition layer to form the first via hole penetrating the transition layer by using the first photoresist pattern as the mask.

In this embodiment, the transition layer 270 may be used to improve the uniformity of the photoresist thereon, and has no impact on the display of the display device. In addition, manufacturing costs of the display substrate may be reduced by wet-etching the transition layer.

Further, the etching the planarization layer through the first via hole to form the second via hole penetrating the planarization layer by using the first photoresist pattern as the mask includes: dry-etching the planarization layer through the first via hole to form the second via hole penetrating the planarization layer by using the first photoresist pattern as the mask.

The level difference between the pixels depends on the planarization layer 260. A pattern quality of the planarization layer 260 may be ensured by using a dry-etching process, thereby ensuring that the level difference between the pixels is small, and ensuring the display performance of the display device.

Further, the forming the planarization layer covering the thin film transistor array layer includes: forming an insulation layer covering the thin film transistor array layer; and forming the planarization layer covering the insulation layer.

In this embodiment, the insulation layer 250 covers a surface of the thin film transistor array layer 220 that is facing away from the base substrate 210, that is, the insulation layer 250 covers the source electrode of the thin film transistor. The insulation layer 250 may be made of an organic insulation material or an inorganic insulation material.

When the planarization layer 260 is not insulative, the insulation layer 250 may be added between the planarization layer 260 and the thin film transistor array layer 220.

Further, subsequent to the forming the second via hole penetrating the planarization layer, the method further includes: forming the photoresist on the insulation layer and the transition layer, exposing and developing the photoresist to form a second photoresist pattern; etching the insulation layer to form an insulation layer pattern by using the second photoresist pattern as a mask; forming an anode material layer on the thin film transistor array layer and the transition layer; forming the photoresist on the anode material layer, exposing and developing the photoresist to form a third photoresist pattern; and etching the anode material layer to form an anode by using the third photoresist pattern as a mask.

Figure 4:
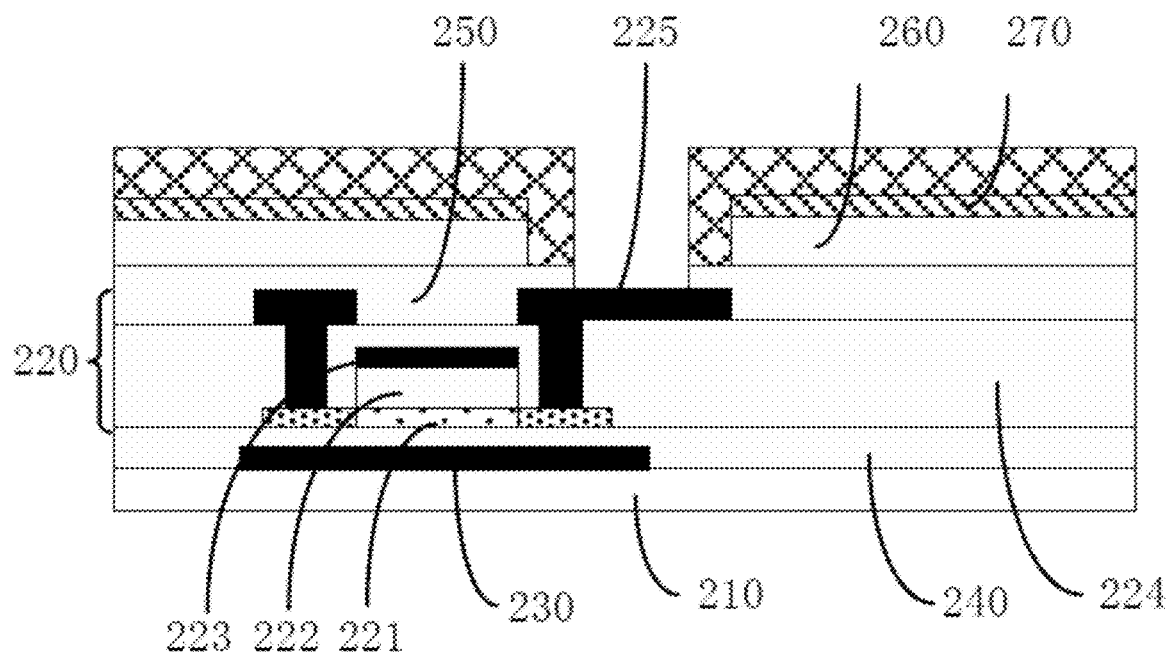
FIG. 4 is a section view of a display substrate in still another stage of the method for manufacturing a display substrate according to some embodiments of the present disclosure.

After forming the first via hole penetrating the transition layer 270 and the second via hole penetrating the planarization layer 260, the insulation layer 250 is dry-etched by using the second photoresist pattern as the mask to form the insulation layer pattern. The insulation layer pattern includes a third via hole penetrating the insulation layer 250, and an orthographic projection of the third via hole onto the base substrate 210 is within an orthographic projection of a metal structure acting as the source electrode in the thin film transistor array layer 220 onto the base substrate 210, as shown in FIG. 4.

Figure 5:
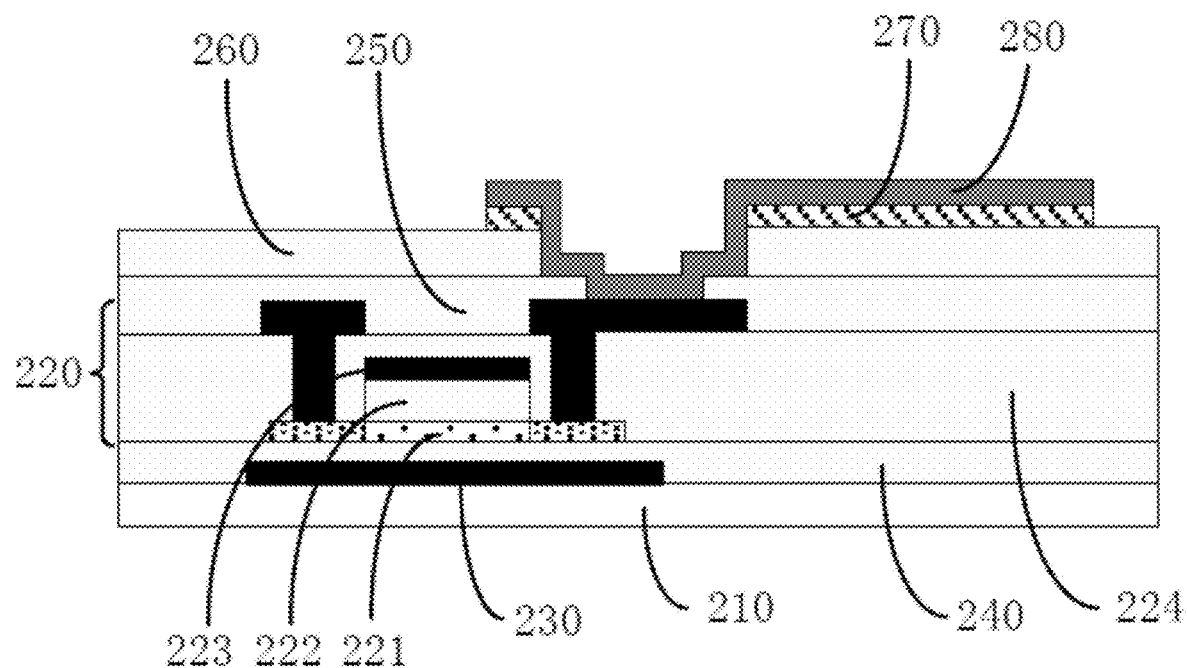
FIG. 5 is a section view of a display substrate in yet another stage of the method for manufacturing a display substrate according to some embodiments of the present disclosure.

An anode material layer covering the transition layer 270 and a part of the metal structure revealed from the third via hole is formed, and by using the third photoresist pattern as a mask, the redundant anode material layer outside the third via hole is removed by etching to obtain the anode 280, and the redundant transition layer outside the third via hole is removed by etching, as shown in FIG. 5.

The anode may be made of a low-resistivity metal or metal oxide, such as ITO, IZO, argentum (Ag).

When the transition layer 270 is made of a conductive material, an electric conductivity between the anode and the source electrode may be improved, and a resistivity may be reduced.

Further, subsequent to the forming the anode, the method further includes: forming a pixel definition layer pattern on the base substrate formed with the anode; forming a light-emitting layer in an area defined by the pixel definition layer pattern; and forming a transparent cathode layer on the light-emitting layer, an orthographic projection of the cathode layer onto the base substrate covering the base substrate.

Figure 6:
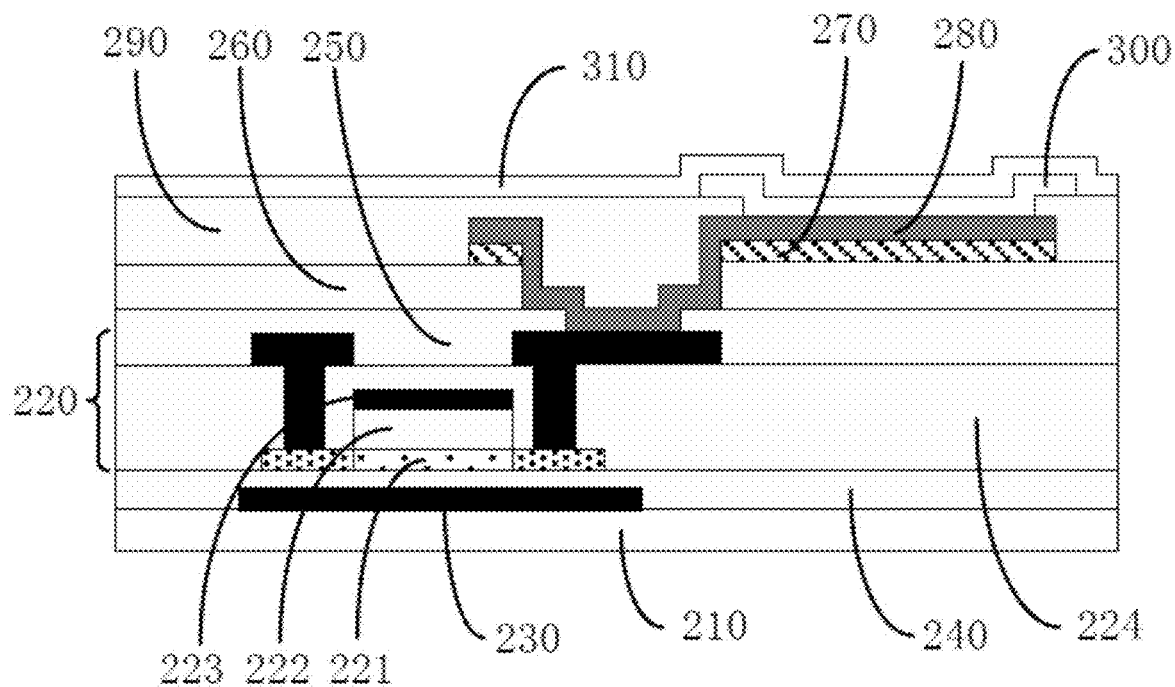
FIG. 6 is a section view of a display substrate in yet still another stage of the method for manufacturing a display substrate according to some embodiments of the present disclosure.

After the anode 280 is formed, the pixel definition layer covering the planarization layer 260 and the anode 280 may be formed by using a deposition method, and the pixel definition layer is etched by using a mask to obtain a pixel definition layer pattern 290, as shown in FIG. 6. The pixel definition layer pattern 290 includes a fourth via hole penetrating the pixel definition layer, and an orthographic projection of the fourth via hole onto the base substrate 210 is within an orthographic projection of the anode 280 onto the base substrate 210.

The light-emitting layer 300 covers a part of the anode 280 revealed from the fourth via hole, so that the anode 280 may provide an electric signal to the light-emitting layer 300 during a display process of the display device. The light-emitting layer 300 may be deposited by evaporation or printing.

The cathode layer 310 covers the pixel definition pattern 290 and the light-emitting layer 300. The cathode layer 310 is made of a transparent conductive oxide, which may be an oxide of at least one element selected from zinc, indium, aluminum, tin, magnesium, argentum, calcium, samarium and barium.

A display substrate is further provided in some embodiments of the present disclosure. As shown in FIG. 6, the display substrate includes: a base substrate; a thin film transistor array layer on the base substrate; a planarization layer covering the thin film transistor array layer; and a transition layer on the planarization layer, where an adhesion between the transition layer and a photoresist is weaker than an adhesion between the planarization layer and the photoresist, the transition layer includes a first via hole, the planarization layer includes a second via hole, an orthographic projection of the first via hole onto the base substrate overlaps with an orthographic projection of the second via hole onto the base substrate.

In some embodiments of the present disclosure, since the transition layer is formed on the planarization layer, and the adhesion between the transition layer and the photoresist is weaker than the adhesion between the planarization layer and the photoresist, the photoresist may be coated more uniformly on the transition layer compared with being coated on the planarization layer As a result, etching the transition layer and the planarization layer by using the first photoresist pattern formed by the photoresist as the mask may reduce or even eliminate a Mura phenomenon occurring in the image displayed by the display device, thereby improving the display performance of the display device. Therefore, the technical solution in the present disclosure may improve the display performance of the display device.

As shown in FIG. 6, the base substrate 210 may be a flexible base substrate, such as a polyimide film, or a rigid base substrate, such as a quartz substrate or a glass substrate.

The thin film transistor array layer 220 may be formed jointly by a plurality of functional film layers, and the plurality of functional film layers may include an active layer 221, a gate insulation layer 222, a gate electrode 223, an interlayer insulation layer 224, a metal layer 225, etc. The plurality of functional film layers jointly form the thin film transistor array layer 220 having a thin film transistor structure. A source electrode of the thin film transistor, i.e., a metal structure in the plurality of functional film layers, is revealed on a side of the thin film transistor array layer 220 that is facing away from the base substrate 210.

The active layer 221 may be made of a metal oxide material, such as an indium gallium zinc oxide (IGZO) material. The active layer 221 may be formed by wet-etching an active material layer using a mask after the active material layer is formed.

The gate insulation layer 222 may be made of an insulation material such as silicon oxide, silicon nitride, and silicon oxynitride. The gate electrode 223 may be made of a commonly used metal such as Mo, Al, Ti, Au, Cu, Hf, Ta, or an alloy material such as AlNd, MoNb, and copper alloy. After sequentially forming a gate insulation material layer and a gate layer, the gate electrode 223 is obtained by wet-etching the gate layer using a mask, and then the gate insulation layer 222 is obtained by dry-etching the gate insulation material layer using the same mask.

The interlayer insulation layer 224 may be made of an organic insulation material or an inorganic insulation material. Two via-holes penetrating the interlayer insulation layer 224 may be formed by photolithography, metal layers are deposited at the two via-holes respectively, and the metal layers are patterned to obtain source and drain electrodes, respectively.

A light-shield pattern 230 may be added between the thin film transistor array layer 220 and the base substrate 210. An orthographic projection of the active layer 221 onto the base substrate 210 falls within an orthographic projection of the light-shield pattern 230 onto the base substrate 210. The light-shield pattern 230 is used to shield the active layer 221 by blocking exterior light directed to the active layer 221. The light-shield pattern 230 may be made of a metal material, and the metal material may be a commonly used metal such as Mo, Al, Ti, Au, Cu, Hf, Ta, or an alloy material such as AlNd, MoNb.

In addition, a buffer layer 240 may be formed between the active layer 221 and the light-shield pattern 230. The buffer layer 240 may be made of an insulation material such as silicon oxide, silicon nitride and silicon oxynitride.

The planarization layer 260 may be directly formed on the thin film transistor array layer 220 if the planarization layer 260 is insulative, and is used to provide a planarization surface, so that a level difference between pixels subsequently disposed on the planarization layer is small, thereby improving a flatness of the pixels to improve the display performance. The planarization layer 260 may be made of an organic resin, a silicon on glass (SOG) material, and the like. The SOG material may reduce the level difference between the pixels from 1.1 um to about 0.026 um, which greatly improves the flatness of pixels. The SOG material refers to a laminated material formed by bonding silicon (single crystal silicon, polysilicon, or porous silicon) with glass using a mechanical or chemical method.

In some embodiments of the present disclosure, the transition layer 270 is formed on the planarization layer 260, the adhesion between the transition layer 270 and the photoresist is weaker than the adhesion between the planarization layer 260 and the photoresist, thus the photoresist may be coated more uniformly on the transition layer 270 compared with being coated on the planarization layer 260. The transition layer 270 and the planarization layer 260 are etched by using the first photoresist pattern, formed by exposing and developing the photoresist on the transition layer 270, as a mask, to obtain a first via hole penetrating the transition layer 270 and a second via hole penetrating the planarization layer 260, as shown in FIG. 3.

In this way, the Mura phenomenon occurring in the image displayed by the display device may be reduced or even eliminated without using an additional mask and without causing impact to other film layers of the display substrate.

The transition layer 270 may be made of a conductive material. For example, the transition layer 270 may be made of a metal material such as Mo, Al, or a metal oxide material such as indium tin oxide (ITO) or indium zinc oxide (IZO). The transition layer 270 may be obtained by performing a sputtering deposition on the planarization layer 260 using a sputtering device.

A thin film transistor formed in the thin film transistor array layer 220 is a top-gate self-aligned type thin film transistor, an etch-stop layer type thin film transistor or a back-channel-etch type thin film transistor.

Further, the display substrate further includes an insulation layer 250 between the thin film transistor array layer 220 and the planarization layer 260, the insulation layer 250 covers the thin film transistor array layer 220, and the planarization layer 260 covers the insulation layer 250.

Further, the insulation layer 250 includes an insulation layer pattern, the display substrate further includes an anode 280, the anode 280 is in contact with the insulation layer 250, the planarization layer 260 and the transition layer 270 through the first via hole, the second via hole and the insulation layer pattern, and the anode covers the transition layer 270, as shown in FIG. 6.

Further, as shown in FIG. 6, the display substrate further includes a transparent cathode layer 310 on a side of the transition layer 270 that is facing away from the base substrate 210, the cathode layer 310 is made of an oxide of at least one element selected from zinc, indium, aluminum, tin, magnesium, argentum, calcium, samarium and barium.

The cathode layer 310 is a transparent conductive oxide.

A display panel is further provided in some embodiments of the present disclosure, including the display substrate described above, the display panel is a top-emitting display panel or a bottom-emitting display panel.

A display device is further provided in some embodiments of the present disclosure, including the display panel described above.

The display device may be a display, a mobile phone, a tablet computer, a television, a wearable electronic device, a navigation display device, etc.

Unless otherwise defined, technical or scientific terms used in the present disclosure shall have general meanings as understood by a person of ordinary skill in the art. Terms "first", "second" and similar terms in the present disclosure do not indicate any order, quantity or priority, but are used only for distinguishing different components. Terms "include", "have" or similar terms are intended to indicate that elements or objects preceding the term encompass elements or objects following the term or equivalents thereof, without excluding other elements or objects. Term "connecting", "connected" or other similar terms are not limited to physical or mechanical connections, but may include electrical connections, whether direct or indirect. Terms such as "Up", "down", "left", "right" are only intended to represent a relative position relationship. When an absolute position of a described object is changed, the relative position relationship may also be changed accordingly.

It should be appreciated that when an element such as a layer, film, region, or substrate is referred to as being "on" or "under" another element, the element may be "on" or "under" another element directly, or there may be intermediate elements.

The embodiments of the present disclosure are described above with reference to the accompanying drawings, but the present disclosure is not limited to the specific implementations described above, and the specific implementations described above are only exemplary and by no means limiting. A person of ordinary skill in the art, having the benefit of the teaching of the present disclosure, may make various forms without departing from the spirit of the present disclosure and the scope of the claims, and all of the forms fall within the scope of the present disclosure.

What is claimed is:

1. A method for manufacturing a display substrate, comprising:
   forming a thin film transistor array layer on a base substrate;
   forming a planarization layer covering the thin film transistor array layer;
   forming a transition layer on the planarization layer, wherein an adhesion between the transition layer and a photoresist is weaker than an adhesion between the planarization layer and the photoresist;
   forming the photoresist on the transition layer, exposing and developing the photoresist to form a first photoresist pattern;
   etching the transition layer to form a first via hole penetrating the transition layer by using the first photoresist pattern as a mask; and
   etching the planarization layer through the first via hole to form a second via hole penetrating the planarization layer by using the first photoresist pattern as a mask, wherein an orthographic projection of the first via hole onto the base substrate overlaps with an orthographic projection of the second via hole onto the base substrate;
   wherein, subsequent to the forming the second via hole penetrating the planarization layer, the method further comprises:
   forming the photoresist on the insulation layer and the transition layer, exposing and developing the photoresist to form a second photoresist pattern;
   etching the insulation layer to form an insulation layer pattern by using the second photoresist pattern as a mask;
   forming an anode material layer on the thin film transistor array layer and the transition layer;
   forming the photoresist on the anode material layer, exposing and developing the photoresist to form a third photoresist pattern; and
   etching the anode material layer to form an anode by using the third photoresist pattern as a mask;
   wherein the anode is in contact with the transition layer through the first via hole, the anode is in direct contact with the planarization layer through the second via hole, and the anode partially covers the transition layer;
   wherein the planarization layer is made of a silicon on glass (SOG) material.

2. The method according to claim 1, wherein the etching the transition layer to form the first via hole penetrating the transition layer by using the first photoresist pattern as the mask comprises:

wet-etching the transition layer to form the first via hole penetrating the transition layer by using the first photoresist pattern as the mask.

3. The method according to claim 1, wherein the etching the planarization layer through the first via hole to form the second via hole penetrating the planarization layer by using the first photoresist pattern as the mask comprises:

dry-etching the planarization layer through the first via hole to form the second via hole penetrating the planarization layer by using the first photoresist pattern as the mask.

4. The method according to claim 3, wherein the forming the planarization layer covering the thin film transistor array layer comprises:

forming an insulation layer covering the thin film transistor array layer; and forming the planarization layer covering the insulation layer.

5. The method according to claim 1, wherein, subsequent to the forming the anode, the method further comprises:

forming a pixel definition layer pattern on the base substrate formed with the anode;

forming a light-emitting layer in an area defined by the pixel definition layer pattern; and forming a transparent cathode layer on the light-emitting layer, wherein an orthographic projection of the cathode layer onto the base substrate covers the base substrate.

6. A display substrate, comprising:

a base substrate;

a thin film transistor array layer on the base substrate;

a planarization layer covering the thin film transistor array layer;

a transition layer on the planarization layer, wherein the transition layer comprises a first via hole, the planarization layer comprises a second via hole, and an orthographic projection of the first via hole onto the base substrate overlaps with an orthographic projection of the second via hole onto the base substrate, wherein an adhesion between the transition layer and a photoresist used in manufacturing the display substrate is weaker than an adhesion between the planarization layer and the photoresist;

wherein the display substrate further comprises an anode, the anode is in contact with the transition layer through the first via hole, the anode is in direct contact with the planarization layer through the second via hole, and the anode partially covers the transition layer;

wherein the planarization layer is made of a silicon on glass (SOG) material.

7. The display substrate according to claim 6, further comprising an insulation layer between the thin film transistor array layer and the planarization layer, wherein the insulation layer covers the thin film transistor array layer, and the planarization layer covers the insulation layer.

8. The display substrate according to claim 7, wherein the insulation layer comprises an insulation layer pattern, the anode is in contact with the insulation layer through the first via hole, the second via hole and the insulation layer pattern.

9. The display substrate according to claim 6, wherein a thin film transistor formed in the thin film transistor array layer is a top-gate self-aligned type thin film transistor, an etch-stop layer type thin film transistor or a back-channel-etch type thin film transistor.

10. The display substrate according to claim 6, further comprising a transparent cathode layer on a side of the transition layer that is facing away from the base substrate, wherein the cathode layer is made of an oxide of at least one element selected from zinc, indium, aluminum, tin, magnesium, argentum, calcium, samarium and barium.

11. A display panel, comprising the display substrate according to claim 6, wherein the display panel is a top-emitting display panel or a bottom-emitting display panel.

12. A display device, comprising a display panel comprising a display substrate, wherein the display panel is a top-emitting display panel or a bottom-emitting display panel;

wherein the display substrate comprises:

a base substrate;

a thin film transistor array layer on the base substrate;

a planarization layer covering the thin film transistor array layer;

a transition layer on the planarization layer, wherein the transition layer comprises a first via hole, the planarization layer comprises a second via hole, and an orthographic projection of the first via hole onto the base substrate overlaps with an orthographic projection of the second via hole onto the base substrate, wherein an adhesion between the transition layer and a photoresist used in manufacturing the display substrate is weaker than an adhesion between the planarization layer and the photoresist;

wherein the display substrate further comprises an anode, the anode is in contact with the transition layer through the first via hole, the anode is in direct contact with the planarization layer through the second via hole, and the anode partially covers the transition layer;

wherein the planarization layer is made of a silicon on glass (SOG) material.

13. The display substrate according to claim 6, wherein an orthographic projection of the transition layer onto the base substrate does not overlap with the orthographic projection of the second via hole onto the base substrate.

14. The display substrate according to claim 6, wherein the transition layer does not cover an inner wall of the second via hole in the planarization layer.

* * * * *